United States Patent
Wu

(10) Patent No.: US 6,977,715 B2
(45) Date of Patent: Dec. 20, 2005

(54) METHOD FOR OPTIMIZING NILS OF EXPOSED LINES

(75) Inventor: Yuan-Hsun Wu, Tao-Yuan Hsien (TW)

(73) Assignee: Nanya Technology Corp., Tao-Yuan Hsien (TW)

( * ) Notice: Subject to any disclaimer, the term of this patent is extended or adjusted under 35 U.S.C. 154(b) by 0 days.

(21) Appl. No.: 10/709,651

(22) Filed: May 19, 2004

(65) Prior Publication Data

US 2005/0259237 A1    Nov. 24, 2005

(51) Int. Cl.[7] .......................... G03B 27/42; G03B 27/32

(52) U.S. Cl. .............................. 355/53; 355/77; 430/5; 430/296

(58) Field of Search .............................. 355/53, 67, 71, 355/75, 77; 430/5, 296; 716/19, 21

(56) References Cited

U.S. PATENT DOCUMENTS

| | | | | |
|---|---|---|---|---|
| 5,242,770 A | * | 9/1993 | Chen et al. | 430/5 |
| 6,787,272 B2 | * | 9/2004 | Yu | 430/5 |
| 2002/0192570 A1 | * | 12/2002 | Smith | 430/5 |
| 2004/0005089 A1 | * | 1/2004 | Robles et al. | 382/141 |
| 2004/0229133 A1 | * | 11/2004 | Socha et al. | 430/5 |
| 2005/0026047 A1 | * | 2/2005 | Yang | 430/5 |
| 2005/0028129 A1 | * | 2/2005 | Hsu et al. | 716/19 |

* cited by examiner

*Primary Examiner*—Alan Mathews
(74) *Attorney, Agent, or Firm*—Winston Hsu

(57) ABSTRACT

A method for optimizing NILS of exposed lines includes providing a photomask layout which has a first straight line and a second straight line parallel with the first straight line and is applied to a Quasar 90 illumination, and adding a first assist pattern between the first and second straight lines, wherein the first assist pattern has a plurality of geometric patterns with similar size arranging as a line parallel with the first straight line.

21 Claims, 8 Drawing Sheets

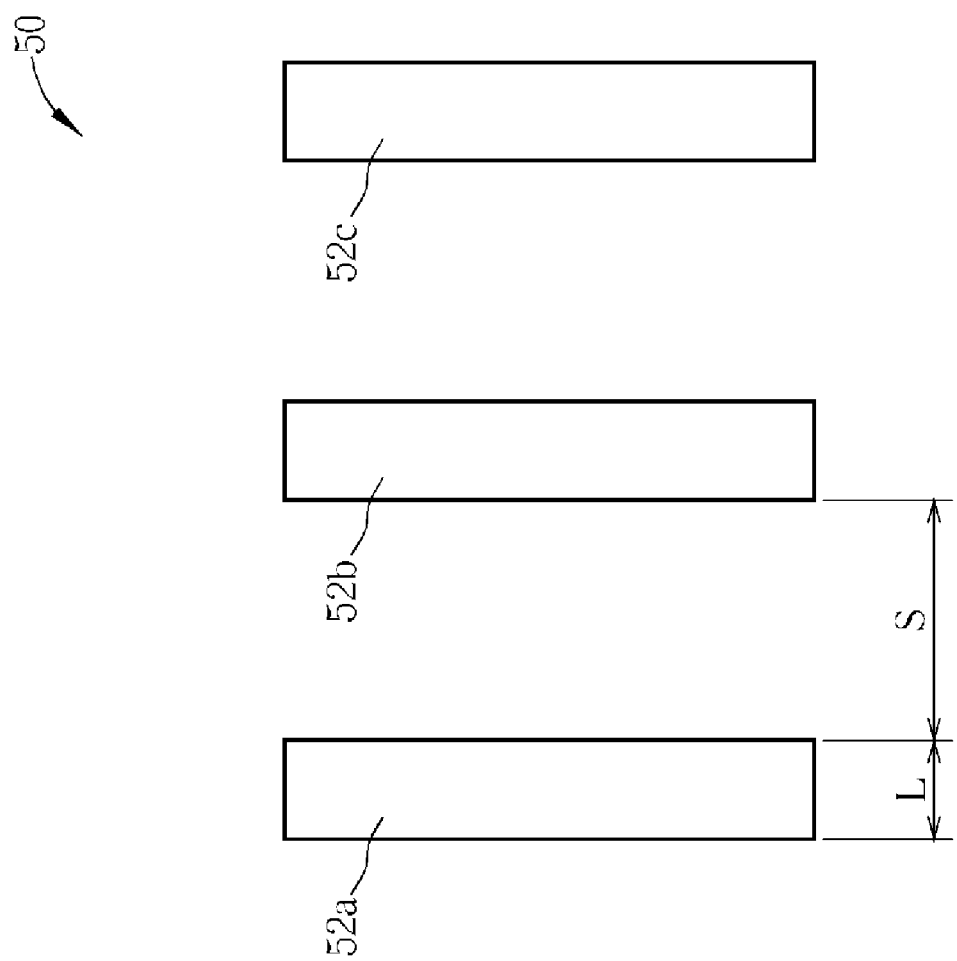

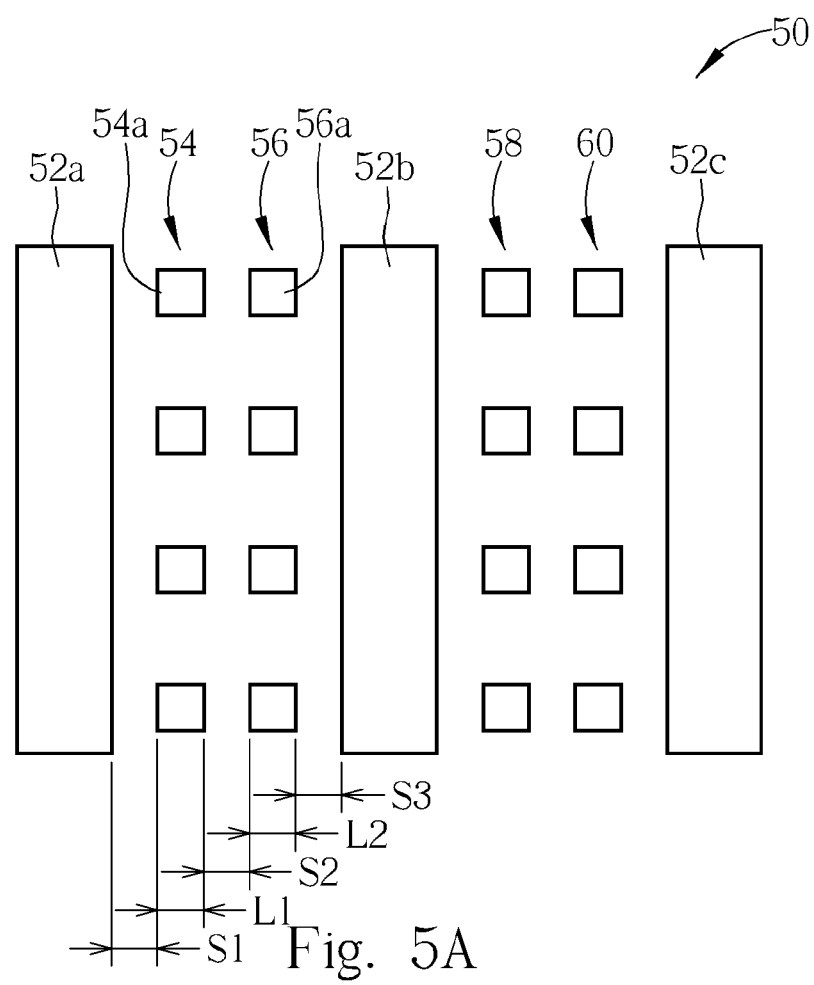
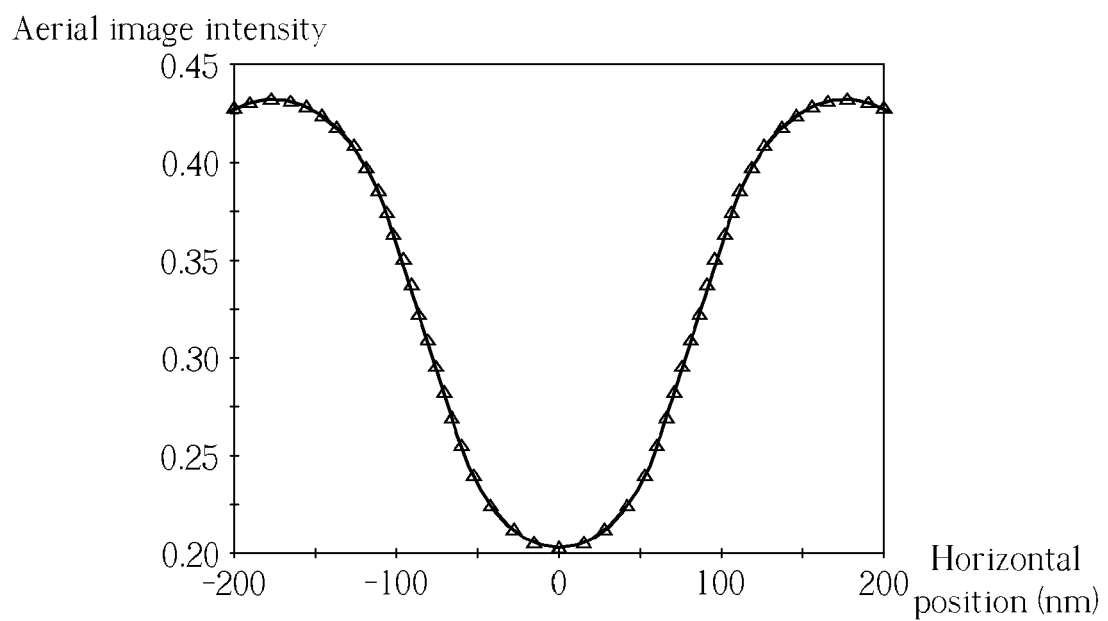
Fig. 5B

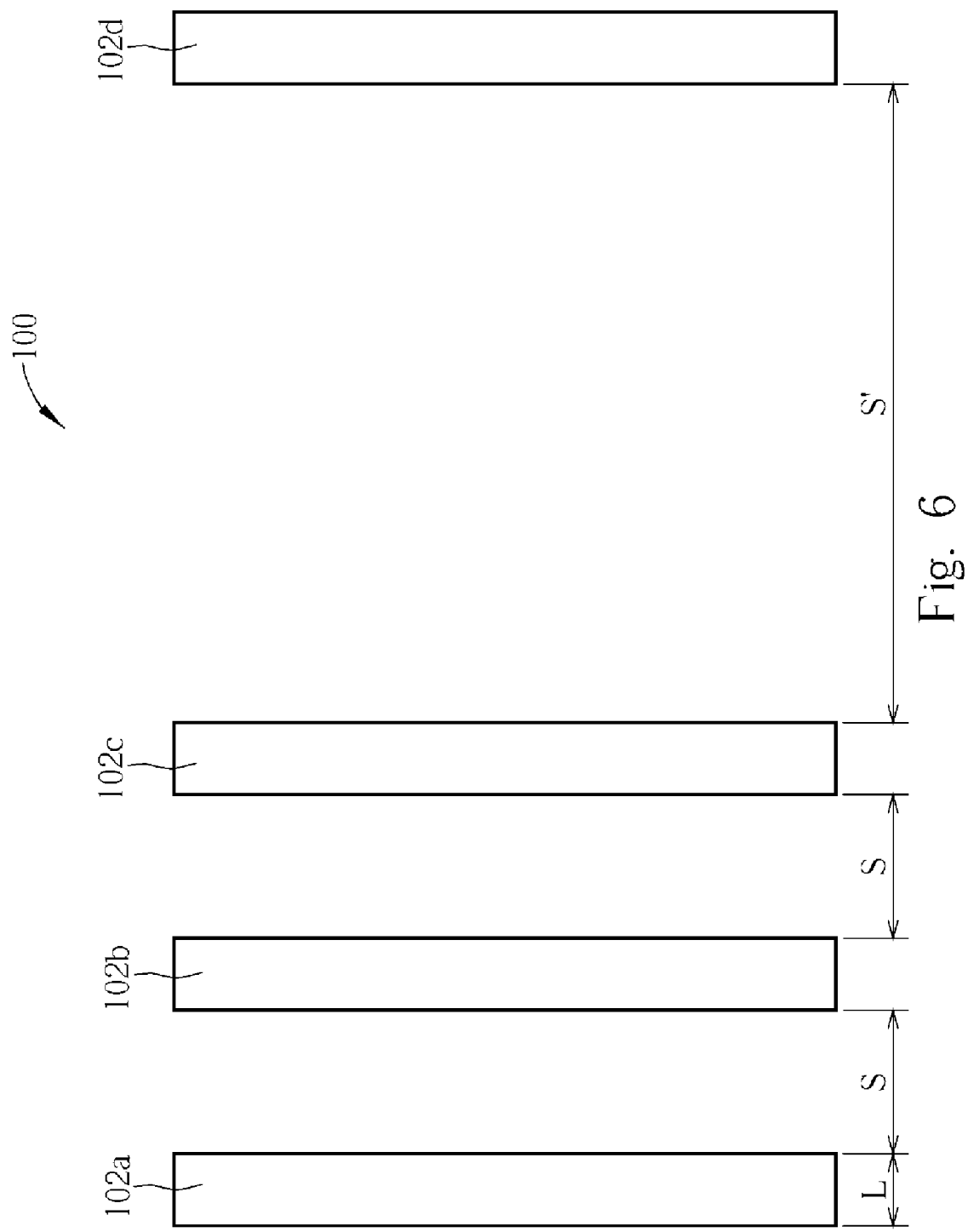

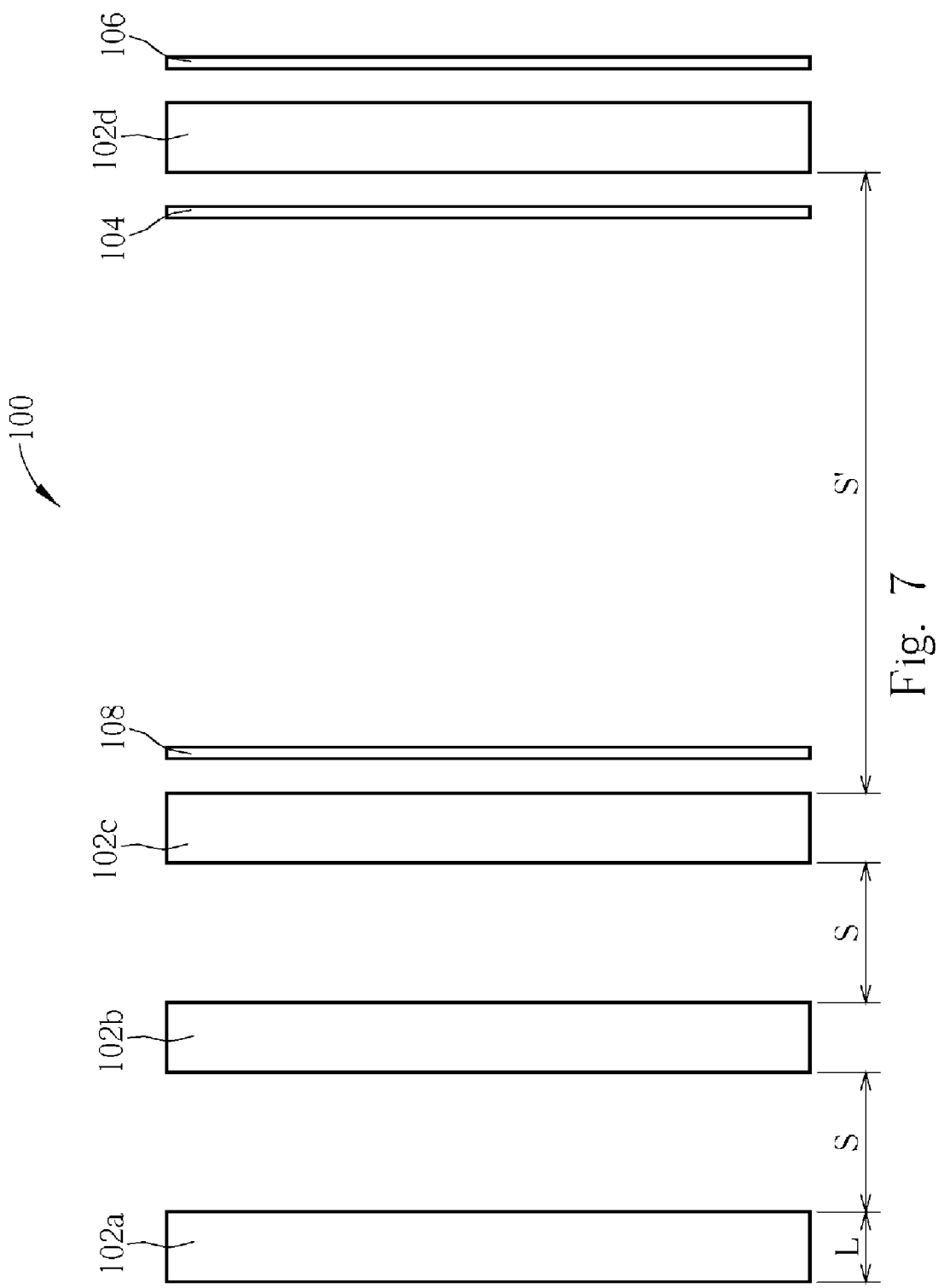

METHOD FOR OPTIMIZING NILS OF EXPOSED LINES

BACKGROUND OF INVENTION

1. Field of the Invention

The invention relates to a method for optimizing normalized image log slope (NILS) of exposed lines of a lithography system, and more particularly, to a method for optimizing NILS of exposed lines by adding assist patterns into a photomask layout.

2. Description of the Prior Art

The lithographic process is a very important step in semiconductor fabrication that transfers the layout of a designed integrated circuit onto a semiconductor wafer. Conventionally, wafer producers design several photomask layouts according to IC layouts to fabricate each of the photomask layouts in a photomask. Then, lithographic and development technologies are used to proportionally transfer the circuit design pattern onto a photoresist layer on the surface of the semiconductor wafer.

As the complexity and the integration of semiconductor circuits increases, the size of the circuit design pattern on the photoresist layer decreases. However, the critical dimensions (CDs) of the pattern on the photoresist layer are limited by the resolution limit of the optical exposure tool. As a result, optical proximity effects (OPE) easily occur in the lithographic process during the formation of highly integrated circuit design patterns on a semiconductor wafer, resulting from overexposure or underexposure and causing a loss of resolution. In other words, optical proximity effects cause a difference between the pattern transferred onto the photoresist layer and the original design pattern.

Please refer to FIG. 1. FIG. 1 is a schematic diagram of a lithography system 10 according to the prior art. The lithography system 10 comprises a scanner system 12 and a semiconductor wafer 24. The scanner system 12 includes a light source 14 positioned near a top region of the scanner system 12, a first lens 16, an aperture plate 18, a second lens 20, and a photomask 22. Light beams from the light source 14 pass through the first lens 16, the aperture plate 18, the second lens 20, and the photomask 22 to the die region 26 to define a pattern of the photomask 22 on the photoresist layer on the wafer 24. The aperture plate 18 is an application of the off-axis illumination (OAI) method, which has one or several apertures that can block vertical incident light and adjust the incident angles of transmitting lights for improving the resolution and depth of focus (DOF) of the lithography process. In order to increase the integration of semiconductor products unceasingly and maintain accuracy at the same time, manufactures have undertaken research and development to refine the aperture pattern of the aperture plate 18 so as to improve the transferring performance by a common light source, such as the light with a wavelength of 248 nm, and the equipment on hand. Among the several kinds of aperture patterns, Quasar 90 is a pattern with four sector apertures, which has an included angle of 90 degrees from the horizontal axis. In contrast to other aperture patterns, such as an annular aperture, Quasar 90 can improve the array CD of the lithography process.

Please refer to FIG. 2. FIG. 2 is a chart of NILS versus space of a photomask layout with a line width of 90 nanometers (nm), which shows the NILS value with various spaces of each aperture. The NILS values represent the performance of the lithography process, and greater NILS values mean the process window of the lithography process is better. Generally speaking, when the wavelength of light source is 248 nms, NILS is required to be more than 1.3–1.5 to form effective patterns on the photoresist layer. As shown in FIG. 2, although the Quasar 90 can improve the array CD of the lithography process, its NILS is less than 1.5 (as shown with the circular mark) when the line width and space are 90 nm and 180 nm–250 nm respectively. These parameters are less than those of other aperture patterns and do not match the limitation of NILS when the light has a wavelength of 248 nm. In this situation, the problem of forbidden pitch occurs and the transferred pattern has serious defects.

Therefore, how to raise NILS value of patterns with the space of 180–250 nm for avoiding forbidden pitch in a lithography system with Quasar 90 illumination to maintain a better array CD is still an important issue in manufactures.

SUMMARY OF INVENTION

It is therefore a primary objective of the claimed invention to provide a method for optimizing NILS of exposed lines by adding assist patterns in the photomask layout to solve the above-mentioned problem.

According to the claimed invention, the method for optimizing NILS of exposed lines comprises providing a photomask layout comprising at least a first straight line and a second straight parallel with the first straight line, which is applied to an OAI with an aperture of Quasar 90, and adding a first assist pattern between the first and the second straight line. The first assist pattern includes a plurality of geometric patterns with similar sizes arranging along a first line direction parallel with the first straight line.

According to the claimed invention, a method for optimizing NILS of exposed lines is further disclosed, which comprises providing a photomask layout comprising a plurality of straight lines parallel with each other, which is applied to an OAI with an aperture of Quasar 90, and adding a plurality of assist patterns between the straight lines, wherein each of the assist pattern comprises a plurality of geometric patterns with similar sizes arranging along a direction parallel with the straight lines. The assist patterns added between any two of the straight lines approximately divide a space between the two straight lines into a plurality of equivalent areas.

The claimed invention provide a method of correcting the photomask layout that add pluralities of geometric patterns arranging along a line between the straight lines of the dense or semi-dense areas where the forbidden pitch problem may occur, so that the NILS of exposed lines may be raised. Accordingly, the equipment on hand of the lithography system can be adopted to perform a lithography process with higher resolution and better CD without being revised. Therefore, the yield of the semiconductor can be improved while the manufactures can also save the cost of new equipments.

These and other objectives of the present invention will no doubt become obvious to those of ordinary skill in the art after having read the following detailed description of the preferred embodiment that is illustrated in the various figures and drawings.

BRIEF DESCRIPTION OF DRAWINGS

FIG. 4 is a schematic diagram of a portion of a photomask layout.

FIG. 5A is a schematic diagram of the photomask layout shown in FIG. 4 with assist patterns according to the present invention.

FIG. 5B is a chart of the aerial image intensity of the photomask layout shown in FIG. 5A.

FIG. 6 is a schematic diagram of a portion of another photomask layout.

FIG. 7 and FIG. 8 are schematic diagrams of the present invention applying to the photomask layout shown in FIG. 6.

DETAILED DESCRIPTION

Figure 1:
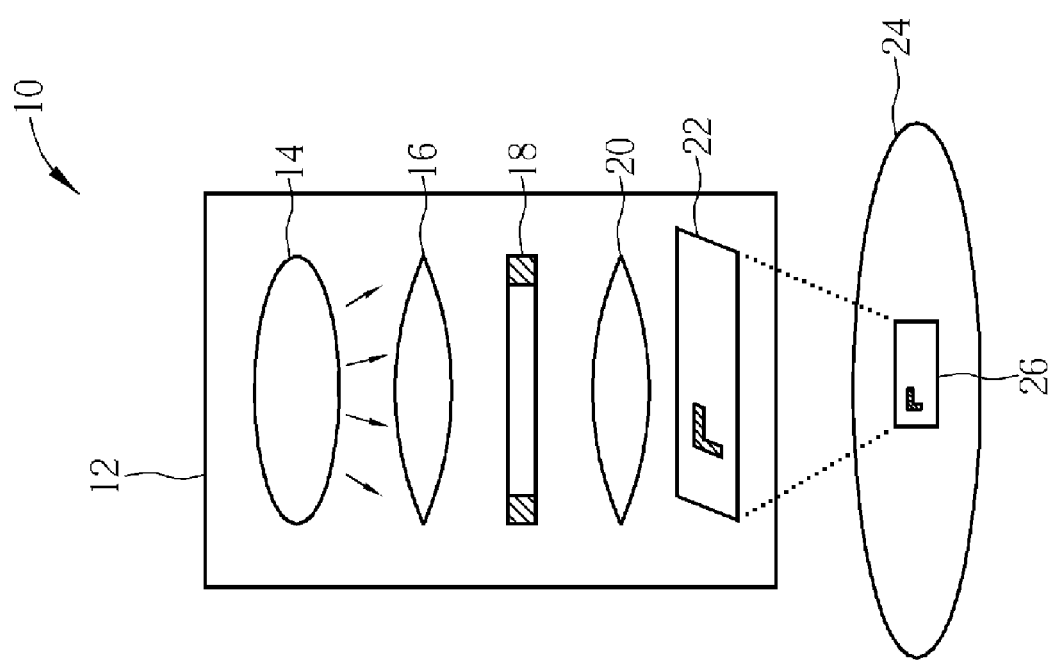
FIG. 1 is a schematic diagram of a lithography system according to the prior art.
Figure 2:
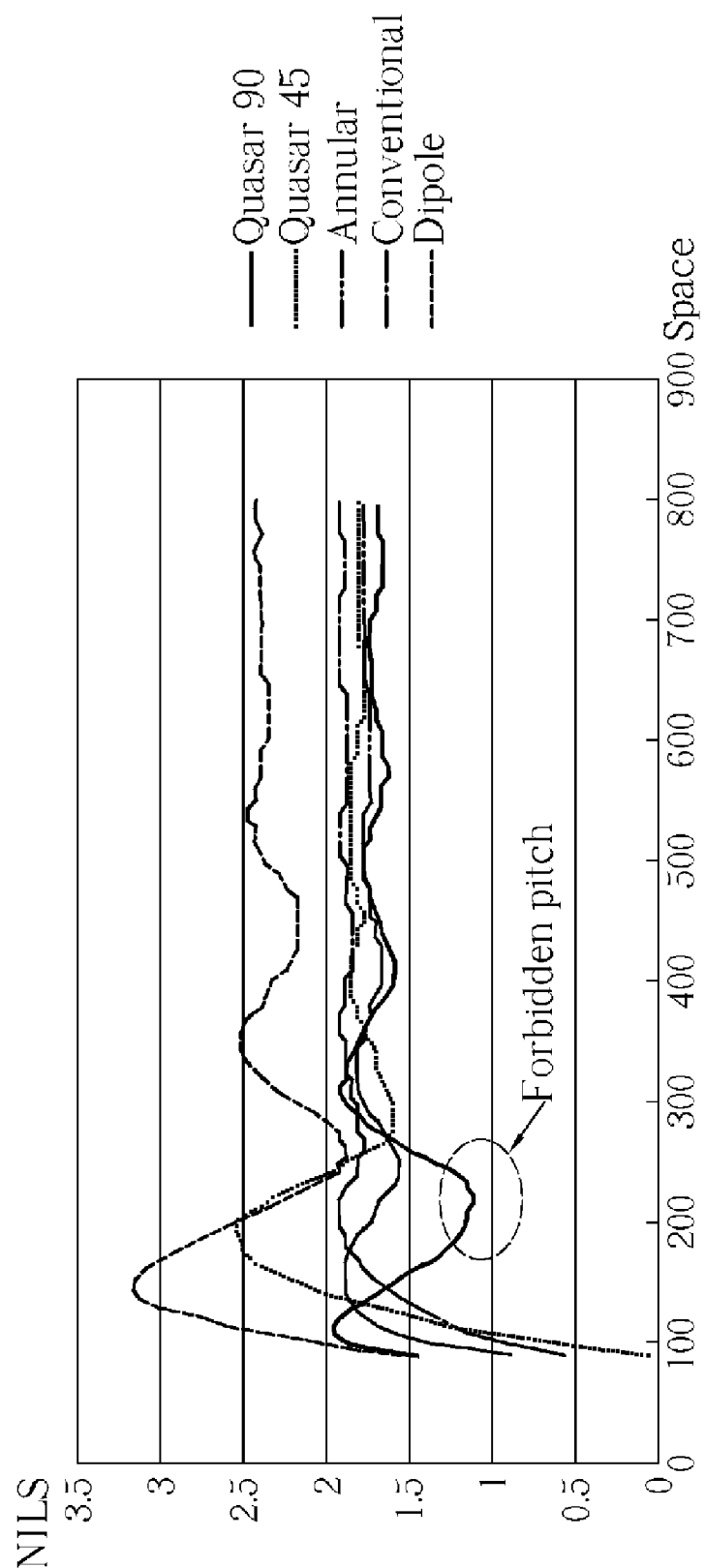
FIG. 2 is a chart of NILS versus space of a photomask layout with a line width of 90 nms.
Figure 3:
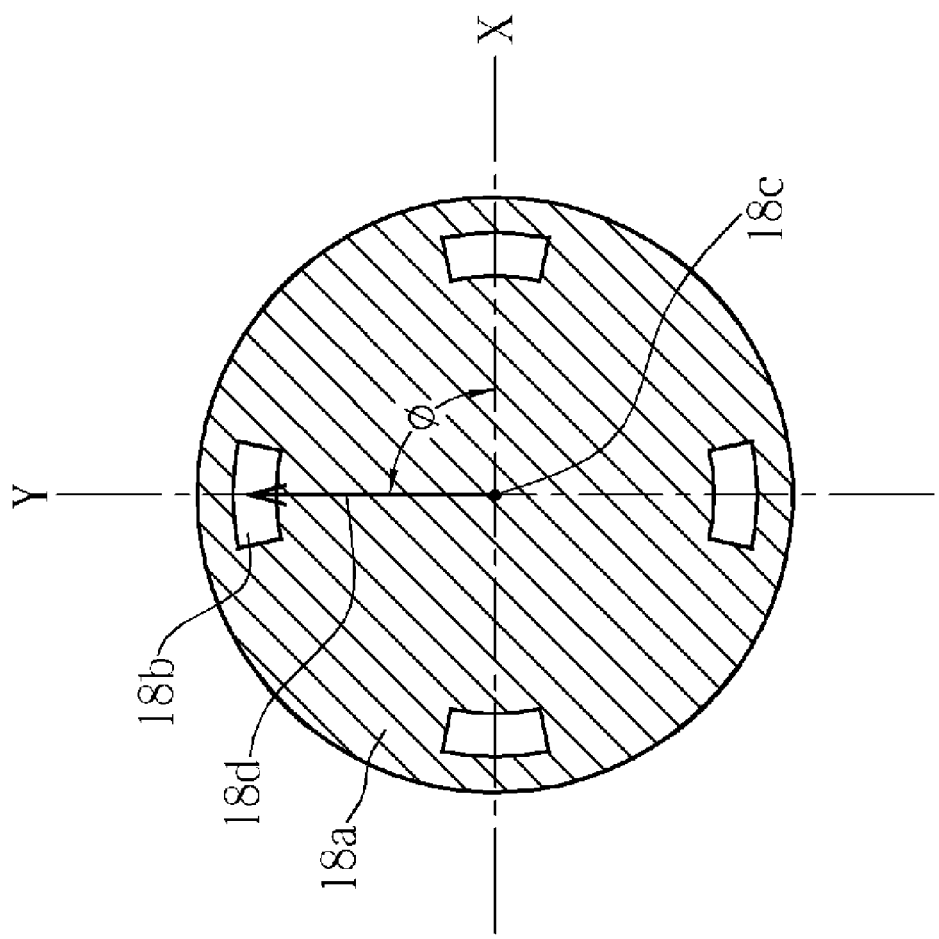
FIG. 3 is a schematic diagram of the aperture plate of Quasar 90.

Referring to FIG. 3, which is a schematic diagram of the aperture plate 18a of Quasar 90. The aperture plate 18a comprises four aperture patterns 18b thereon, which have the shape of a sector and are arranged in the periphery area of the aperture plate 18a. A center point 18c is defined on the aperture plate 18a. A horizontal axis X and a vertical axis Y intersecting the center point 18c are further defined on the aperture plate 18a. The distance between the center point 18c and the aperture pattern 18b is defined by an offset 18d. As shown in FIG. 3, the included angle φ of the offset 18d and the horizontal axis X is 90 degrees. Therefore, applying the aperture plate 18a to the scanner system 12 shown in FIG. 1 means the lithography system 10 adopts an OAI with Quasar 90 as the light source for exposing photomask. Similarly, if the included angle φ of the offset 18d and the horizontal axis X is 45 degrees, the light source of exposure is a Quasar 45 illumination. Since the present invention focuses on solving the problem of forbidden pitch of dense and semi-dense area occurring under the Quasar 90 illumination, all of the embodiments described below are under the condition of Quasar 90 illumination.

Please refer to FIG. 4. FIG. 4 is a schematic diagram of a portion of a photomask layout 50, wherein the photomask layout 50 will be exposed in a scanner system using the OAI with an aperture of Quasar 90 shown in FIG. 3. The photomask layout 50 comprises a plurality of parallel straight lines while FIG. 4 only shows a first straight line 52a, a second straight line 52b, and a third straight line 52c. As shown in FIG. 4, a line width L of the first, the second, and the third straight lines 52a, 52b, 52c is about 90 nm, and a space S is about 220 nm. As mentioned above, if the photomask layout 50 is exposed in a scanner system with the Quasar 90 illumination for performing a lithography process, the problem of forbidden pitch will occur.

Please refer to FIG. 5A, which is a schematic diagram of the photomask layout shown in FIG. 4 with assist patterns added according to the present invention. As shown in FIG. 5A, for improving the resolution of the lithography process of the photomask layout 50, a plurality of assist patterns 54, 56, 58, 60 are added between the straight lines 52a, 52b, 52c, wherein each of the assist patterns 54, 56, 58, 60 comprises a plurality of geometric patterns arranging along a direction parallel with the straight lines 52a, 52b, 52c. Taking the assist pattern 54 as an example, it comprises plurality of square geometric patterns 54a with similar sizes, which arrange along a direction parallel with the straight line 52a, and the spaces between the geometric patterns 54a are all the same. Similarly, another assist pattern 56 positioned between the first straight line 52a and the second straight line 52b comprises a plurality of square geometric patterns 56a with the same sizes. Furthermore, the assist patterns 58, 60 positioned between the second straight line 52b and the third straight line 52c also have similar patterns.

It should be noted that the principle of adding the assist patterns 54, 56, 58, 60 is to make the assist patterns (for example, the assist patterns 54 and 56) between any two of the straight lines (for example, the straight lines 52a, 52b) divide the space between said two straight lines into equivalent areas, and the spaces between the assist patterns are approximately equal to the width of the assist patterns. For example, the space S2 between the assist patterns 54 and 56 is approximately equal to the line widths L1 and L2 of the assist patterns 54 and 56, which are the lengths of the square geometric patterns 54a and 56a. Accordingly, the arrangement of the first, the second, and the third straight lines 52a, 52b, and 52c has regularity. In this embodiment, the wavelength of the illumination source is 248 nm, and the square geometric patterns 54a and 56a have the size of 40 nm×40 nm and divide the space between the first straight line 52a and the second straight line 52b into three equivalent areas so that the space S1 between the assist pattern 54 and the first straight line 52a, the space S2 between the assist pattern 54 and the assist pattern 56, and the space S3 between the assist pattern 56 and the second straight line 52b are approximately the same.

Please refer to FIG. 5B, which is a chart of the aerial image intensity of the photomask layout 50 shown in FIG. 5A. Taking the straight line 52b as an origin of the horizontal position, the curve slope of the aerial image intensity of the straight line 52b between the nearest straight lines 52a and 52c increases after the assist patterns 54, 56, 58, and 60 are added, which means the aerial image contrast is raised. Therefore, when transferring the straight lines 52a, 52b, and 52c to the photoresist layer, the resolution of the exposed straight lines 52a, 52b, and 52c can be improved. Meanwhile, the NILS is raised from 1.15 to 2.5. Thus the problem of forbidden pitch can be solved.

Please refer to FIG. 6, which is a schematic diagram of a portion of another photomask layout 100. The photomask layout 100 comprises a first straight line 102a, a second straight line 102b, a third straight line 102c, and a fourth straight line 102d parallel with each other, wherein the first, the second, and the third straight lines 102a, 102b, 102c are located in a dense or semi-dense area with a line width L about 90 nm and a space S about 180 nms. The fourth straight line 102d is located in an iso area and has a space S more than 700 nm away form adjacent straight lines, such as the third straight line 102c. Similarly, when the photomask layout 100 is applied to a Quasar 90 illumination, the problem of forbidden pitch occurs at the first, the second, and the third straight lines 102a, 102b, 102c. Furthermore, there are other problems occurring at the fourth straight line 102d locating in the iso area in a conventional lithography process. The problem of the conventional lithography process is that the patterns in the iso area have lower resolution and reduced common process window with the dense area. Therefore, the present invention method can be performed with an optical proximity correction (OPC) to avoid forbidden pitches and improve the common process window.

Figure 8:
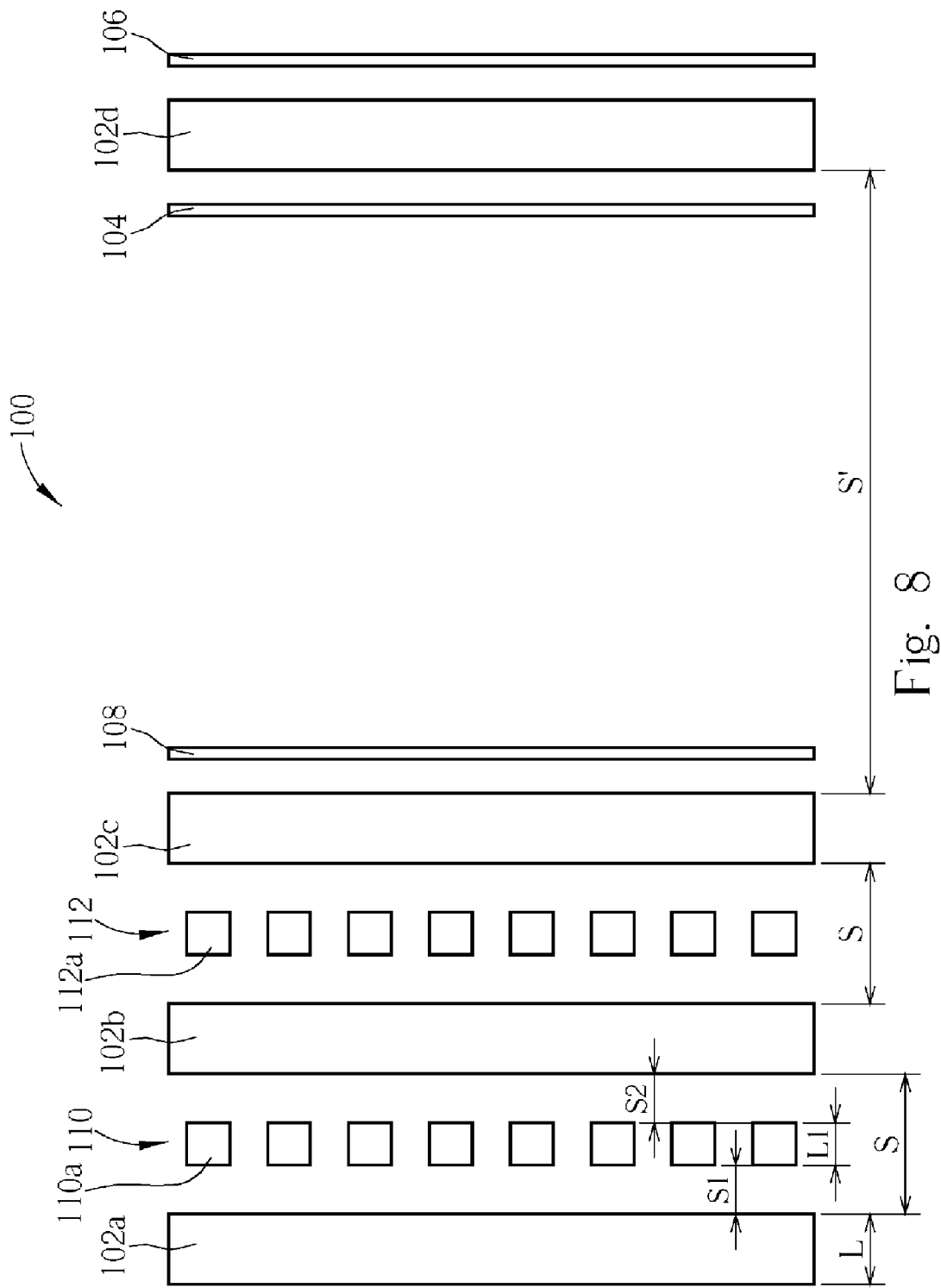

Please refer to FIGS. 7–8, which are schematic diagrams of the present invention applying to the photomask layout 100 shown in FIG. 6. First, an OPC is performed to improve the resolution of the original photomask layout 100 and correct the defects caused by OPE. For example, a rule-based OPC or a model-based OPC can be utilized. As shown in FIG. 7, when the OPC is performed to improve the resolution of the patterns of the iso area, two scattering bars 104 and 106 are added to the two sides of the fourth straight line 102d, and a scattering bar 108 is added to one side of the third straight line 102c. After the OPC process, a corrected photomask layout 100 is produced.

Then, as shown in FIG. 8, the assist patterns 110 and 112 are added between the first, the second, and the third straight lines 102a, 102b, and 102c where forbidden pitches may occur. Each of the assist patterns 110 and 112 comprises a plurality of geometric patterns 110a, 112a with similar sizes arranging along a direction parallel with the first straight line 102a. In this embodiment, the first, the second, and the third straight lines 102a, 102b, and 102c have a smaller space S. Therefore, only an assist pattern 110 is added between the first straight line 102a and the second straight line 102b. Similarly, only an assist pattern 112 is added between the third straight line 102c and the second straight line 102b. For making the spaces between the first, the second, and the third straight lines 102a, 102b, 102c have regularity, each of the assist patterns 110, 112 has to divide the spaces S into equivalent areas. Taking the assist pattern 110 as an example, the line width L1 is approximately equal to the space S1 and the space S2.

After positioning the assist patterns 110 and 112, a photomask is fabricated according to the corrected photomask layout 100 for applying to a lithography system with the Quasar 90 illumination. Therefore, the advantage of the Quasar 90 illumination of improving the array CD can be retained, and the NILS of the Quasar 90 can also be raised to solve the problem of forbidden pitch.

The present invention method for improving NILS of exposed lines can apply to the lithography process using Quasar 90 illumination with different lens of the scanner system or wavelength of the light source. It should be noted that the principle of adding the assist patterns is for making the geometric patterns of the assist patterns divide the space between the straight lines into equivalent areas, so that the spaces between the straight lines where forbidden pitches may occur and the assist patterns have regular arrangement for increasing the NILS value of exposed lines. However, the amount, width, and size of the assist patterns added between any two of the straight lines are determined according to the wavelength of the light source of Quasar 90 illumination, the numerical aperture (NA) of the lens of the OAI, and the space between the two straight lines. For example, when the wavelength of the light source is less, the length of the geometric patterns of the assist patterns has to be smaller accordingly, provided that the assist patterns will not be transferred to the photoresist layer of the semiconductor wafer. Therefore, the NILS can be improved through adjusting the amount, width, and space of the assist patterns between any two of the straight lines. According to the present invention method, the NILS value of 2.5 can be achieved.

In contrast to the prior art, the present invention provides a method to add assist patterns comprising geometric patterns into the photomask layout so as to improve the aerial image contrast and NILS, and therefore to solve the problem of forbidden pitch occurring in the Quasar 90 illumination system in the prior art. Consequently, the resolution of the lithography process can be improved accordingly without revising machines of the lithography system or its inner devices. Therefore, the cost of revising machines can also be saved.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for optimizing normalized image log slope (NILS) of exposed lines of a lithography system comprising:
   providing a photomask layout which is applied to an off-axis illumination (OAI) with an aperture of Quasar 90, the photomask layout comprising a first straight line and a second straight line parallel with the first straight line; and
   adding a first assist pattern between the first and the second straight lines, the first assist pattern including a plurality of square geometric patterns with similar sizes arranging along a first line direction which is parallel with the first straight line.

2. The method of claim 1, wherein the first assist pattern divides a space between the first and the second straight lines into two equivalent areas.

3. The method of claim 1, wherein a length of the square patterns is approximately equal to a space between the first assist pattern and the first straight line and to a space between the first assist pattern and the second straight line.

4. The method of claim 1 further comprising adding a second assist pattern between the first straight line and the first assist pattern, the second assist pattern including a plurality of geometric patterns with similar sizes arranging along a second line direction which is parallel with the first straight line.

5. The method of claim 4, wherein a space between the second assist pattern and the first assist pattern, and a space between the second assist pattern and the first straight line are approximately equal to a space between the first assist pattern and the second straight line.

6. The method of claim 1 further comprising performing an optical proximity correction (OPC) to produce a corrected photomask layout before the step of adding the first assist pattern into the photomask layout.

7. A method for optimizing NILS of exposed lines of a lithography system comprising:
   providing a photomask layout which is applied to an OAI with an aperture of Quasar 90, the photomask layout comprising a plurality of straight lines parallel with each other; and
   adding a plurality of assist patterns between any two of the adjacent straight lines, each of the assist patterns including a plurality of geometric patterns with similar sizes arranging along a first direction which is parallel with the straight lines, wherein a width in a third direction perpendicular to the first direction of the geometric patterns is approximately equal to a space between each of the straight lines and the adjacent assist patterns.

8. The method of claim 7, wherein an amount of the assist patterns added between any two of the adjacent straight lines is determined according to the space between the two straight lines.

9. The method of claim 7, wherein an amount and a width of the assist patterns added between any two of the straight lines are determined according to a numerical aperture (NA) of a lens of the OAI with the aperture of Quasar 90.

10. The method of claim 7, wherein a width of the assist patterns is determined according to a wavelength of the OAI with the aperture of Quasar 90.

11. The method of claim 7, wherein the wavelength of the OAI with the aperture of Quasar 90 is 248 nanometers (nm).

12. The method of claim 11, wherein the NILS of the straight lines can be optimized to a value above 2.5.

13. The method of claim 11, wherein a space between the straight lines is about 180 to 250 nanometers.

14. The method of claim 13, wherein a line width of the straight lines is about 90 nanometers.

15. The method of claim 7, wherein the geometric patterns are square patterns.

16. The method of claim 7 further comprising performing an OPC to produce a corrected photomask layout before the step of adding the assist patterns into the photomask layout.

17. A method for optimizing normalized image log slope (NILS) of exposed lines of a lithography system comprising:
   providing a photomask layout which is applied to an off-axis illumination (OAI) with an aperture of Quasar 90, the photomask layout comprising a first straight line and a second straight line parallel with and adjacent to the first straight line; and
   adding a first assist pattern between the first and the second straight lines, the first assist pattern including a plurality of geometric patterns with similar sizes arranging along a first direction which is parallel with the first straight line, a width in a third direction perpendicular to the first direction of the geometric patterns is approximately equal to a space between the first assist pattern and the second straight line.

18. The method of claim 17, wherein the length in the third direction perpendicular to the first direction of the geometric patterns is approximately equal to a space between the first assist pattern and the first straight line.

19. The method of claim 17 further comprising adding a second assist pattern between the first straight line and the first assist pattern, the second assist pattern including a plurality of geometric patterns with similar sizes arranging along a second line direction which is parallel with the first straight line.

20. The method of claim 19, wherein a space between the second assist pattern and the first assist pattern, and a space between the second assist pattern and the first straight line are approximately equal to a space between the first assist pattern and the second straight line.

21. The method of claim 17 further comprising performing an optical proximity correction (OPC) to produce a corrected photomask layout before the step of adding the first assist pattern into the photomask layout.

* * * * *